United States Patent
Loftus et al.

(10) Patent No.: US 9,784,780 B2
(45) Date of Patent: Oct. 10, 2017

(54) BATTERY SIMULATOR WITH VARIABLE CURRENT CAPACITY

(71) Applicant: Ford Global Technologies, LLC, Dearborn, MI (US)

(72) Inventors: Michael Edward Loftus, Northville, MI (US); Benjamin A. Tabatowski-Bush, South Lyon, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 256 days.

(21) Appl. No.: 14/222,764

(22) Filed: Mar. 24, 2014

(65) Prior Publication Data

US 2015/0268285 A1    Sep. 24, 2015

(51) Int. Cl.
*G01R 31/00* (2006.01)
*G01R 31/36* (2006.01)
(Continued)

(52) U.S. Cl.
CPC .......... *G01R 31/007* (2013.01); *B60L 3/0046* (2013.01); *B60L 3/12* (2013.01); *B60L 7/14* (2013.01); *B60L 11/123* (2013.01); *B60L 11/14* (2013.01); *B60L 11/1816* (2013.01); *B60L 11/1846* (2013.01); *B60L 11/1861* (2013.01); *B60L 11/1866* (2013.01); *B60L 11/1868* (2013.01); *B60L 11/1877* (2013.01);
(Continued)

(58) Field of Classification Search
CPC ............ G06F 17/50; G06F 17/10; G06F 7/00; G01N 27/416; G01R 31/00; G01R 31/02
See application file for complete search history.

(56) References Cited

U.S. PATENT DOCUMENTS

| | | |
|---|---|---|
| 5,444,378 A | 8/1995 | Rogers |
| 8,255,199 B2 | 8/2012 | Yi |

(Continued)

OTHER PUBLICATIONS

Welsh, Jr., Electrical and Computer Engineering Graduate Program, The Ohio State University, 2009, "A of Comparison of Active and Passive Cell Balancing Techniques for Series/Parallel Battery Packs."

(Continued)

*Primary Examiner* — Giovanni Astacio-Oquendo
*Assistant Examiner* — Alvaro Fortich
(74) *Attorney, Agent, or Firm* — David B. Kelley; Brooks Kushman P.C.

(57) ABSTRACT

A battery simulator can operate to provide different outputs. These outputs provide different characteristics related to how a device under test operates. In an example, a controller such as an electronic control module (ECM) or battery energy control module (BECM) can be tested. The battery simulator may provide different modes, e.g., a high current mode or a voltage change over time mode. A traction battery simulator may include a controller, analog output circuitry being controlled by the controller to output test current and test voltage, and switching circuitry connected to the analog output circuitry that has a first state and a second state. The first state is to provide an increased change in voltage over change in time relative to the second state. The second state is to provide an increased capacitance over the first state.

18 Claims, 6 Drawing Sheets

(51) Int. Cl.
*B60L 3/00* (2006.01)
*B60L 3/12* (2006.01)
*B60L 7/14* (2006.01)
*B60L 11/12* (2006.01)
*B60L 11/14* (2006.01)
*B60L 11/18* (2006.01)
*G01R 35/00* (2006.01)

(52) U.S. Cl.
CPC ...... *G01R 31/3651* (2013.01); *B60L 2210/10* (2013.01); *B60L 2210/30* (2013.01); *B60L 2210/40* (2013.01); *B60L 2240/36* (2013.01); *B60L 2240/545* (2013.01); *B60L 2240/547* (2013.01); *B60L 2240/549* (2013.01); *B60L 2250/16* (2013.01); *G01R 35/00* (2013.01); *Y02T 10/6217* (2013.01); *Y02T 10/7005* (2013.01); *Y02T 10/7022* (2013.01); *Y02T 10/7044* (2013.01); *Y02T 10/7061* (2013.01); *Y02T 10/7066* (2013.01); *Y02T 10/7072* (2013.01); *Y02T 10/7077* (2013.01); *Y02T 10/7216* (2013.01); *Y02T 10/7241* (2013.01); *Y02T 90/121* (2013.01); *Y02T 90/127* (2013.01); *Y02T 90/128* (2013.01); *Y02T 90/14* (2013.01); *Y02T 90/163* (2013.01); *Y02T 90/169* (2013.01); *Y04S 30/14* (2013.01)

(56) References Cited

U.S. PATENT DOCUMENTS

| | | | | |
|---|---|---|---|---|
| 2003/0236656 A1* | 12/2003 | Dougherty | .......... | G06F 17/5036 703/14 |
| 2004/0212367 A1* | 10/2004 | Dougherty | ......... | G01R 31/3651 324/426 |
| 2008/0086247 A1* | 4/2008 | Gu | ........................ | H02J 7/0022 701/36 |
| 2009/0198399 A1* | 8/2009 | Kubo | .................. | B60L 11/1855 701/22 |
| 2010/0004885 A1* | 1/2010 | Nakanishi | ............. | B60L 3/0046 702/63 |
| 2010/0194339 A1* | 8/2010 | Yang | ..................... | H02J 7/0016 320/116 |
| 2010/0198536 A1* | 8/2010 | Hess | ................... | G01R 31/3679 702/63 |
| 2011/0054816 A1* | 3/2011 | Prada | ................. | G01R 31/3651 702/63 |
| 2011/0060565 A1* | 3/2011 | Sciarretta | ........... | G01R 31/3651 703/2 |
| 2011/0153239 A1* | 6/2011 | Schweiger | ........ | H01M 10/4285 702/63 |
| 2012/0119765 A1* | 5/2012 | Bracker | ................. | G01R 31/36 324/750.01 |
| 2012/0150503 A1* | 6/2012 | Haupt | ................ | G01R 31/3651 703/2 |
| 2012/0239340 A1* | 9/2012 | Chen | ................... | G01R 31/3627 702/123 |
| 2013/0004842 A1* | 1/2013 | Abrahamson | ....... | H01M 4/0404 429/204 |
| 2013/0043833 A1* | 2/2013 | Katz | ...................... | H02J 7/025 320/108 |
| 2013/0076368 A1* | 3/2013 | Bianco | ................... | G01R 31/00 324/510 |

OTHER PUBLICATIONS

Jain, Sachin, IEEE Xplore Digital Library, Jun. 2012, "High gain, high efficiency DC-DC converter with soft switching feature."

Moore, et al., Society of Autmotive Engineers, Inc., 2001, "A Review of Cell Equalization Methods for Lithium Ion and Lithium Polymer Battery Systems."

Kroeze, IEEE Explore, Power Electronics Conference, Jun. 15-19, 2008, "Electrical battery model for use in dynamic electric vehicle simulations."

Hu, IEEE Xplore, American Control Conference, Jun. 11-13, 2008, pp. 318-325, "Model-based Calibration for battery characterization in HEV applications."

\* cited by examiner

BATTERY SIMULATOR WITH VARIABLE CURRENT CAPACITY

TECHNICAL FIELD

Various embodiments relate to systems and methods for simulating a battery, and specifically for simulating a battery or battery pack with a variable current capacity that may be useful for testing components and designs for a hybrid electric vehicle.

BACKGROUND

Batteries used in moving devices can experience a wide range of usage, e.g., loads, charging, state of charge, environment, lifetime and the like. Accordingly, batteries are tested over many different scenarios to prove that the battery and its controlling devices and related methods provide adequate performance. Specifically, batteries used in vehicles are subject to a wide range of usage. A battery simulator may be used to test a battery design and a controller design to prove that they are sufficient for use in a moving device.

SUMMARY

A battery simulator can operate to provide different outputs for testing battery control circuitry. The different outputs provide different battery characteristics to a device under test, e.g., a controller such as an electronic control module (ECM) or battery energy control module (BECM). The battery simulator may provide different modes, e.g., a high current mode or a voltage change over time mode.

An electric vehicle battery simulator can include a controller, analog output circuitry configured to be controlled by the controller to output test current and test voltage, and switching circuitry connected across the analog output circuitry, the circuitries collectively having a first state and a second state, and the second state having an increased capacitance that hinders rates of change in the test voltage relative to the first state.

In an example, the controller controls whether the collective circuitries are in the first state or the second state based on current demand.

In an example, the second state provides for a higher current state than the first state.

In an example, the switching circuitry includes a switch and a capacitor electrically connected across an output of the analog output circuitry.

In an example, a plurality of power supplies are connected to simulate a traction battery at the analog circuitry.

In an example, the collective circuitries are connected to output the test current and test voltage to an electronic control module for a hybrid electric vehicle.

A method to simulate a hybrid vehicle battery includes starting switch control at an output, in response to a demand for current exceeding a threshold, using the switch control to close a switch and apply additional capacitance across the output, and in response to a demand for current less than the threshold, using the switch control to open the switch to remove the additional capacitance from across the output.

In an example, the method can include altering a rate of change of a voltage signal applied to the output and to an electronic control module connected to the output.

In an example, the method can include using the switch control to close the switch damps the rate of change of the voltage signal applied to the output.

An electric vehicle battery simulation method can include controlling analog output circuitry to output test current and test voltage and switching the circuitry between a first state and a second state based on current demand, the first state having a decreased capacitance that permits increased rates of change in voltage relative to the second state.

In an example, switching includes closing a switch to connect a capacitor across the analog output circuitry to switch from the first state to the second state.

DETAILED DESCRIPTION

Figure 1:
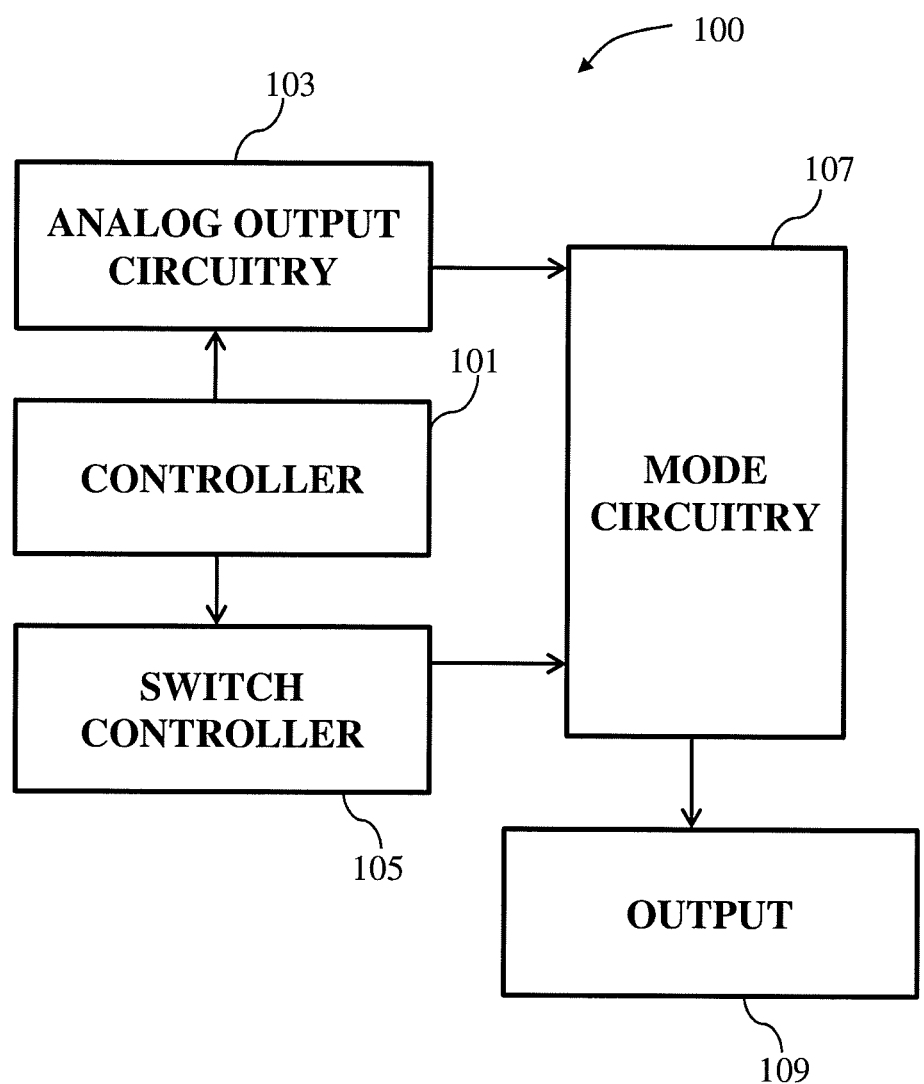
FIG. 1 is a schematic view of a battery simulation system.

The present document details embodiments of the present invention herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The present inventors have recognized a need for improved battery simulation in testing a battery design, a controller design or a vehicle design. During battery simulation it may be desired to produce a battery simulation to test controllers for Full Hybrid Electric Vehicle (FHEV), Mild Hybrid Electric Vehicle (MHEV), Plug-in Hybrid Electric Vehicle (PHEV), and Pure Electric Vehicle (BEV or EV) or other mobile devices. However, a battery simulator does not produce a "pack" current to propel a vehicle as the real battery cells provide. Nonetheless, a controller, e.g., an electronic control module (ECM) or battery energy control module (BECM), includes features related to cell-balancing and, hence, does require the battery simulator to provide actual current to test the controller. In an example, a potential cell-balancing strategy is Autonomous Cell Balancing, which is a method of decentralized cell balancing control that requests a current sourcing capability of up to 5 A per battery cell.

The battery simulator has been a tool in identifying controller issues by being able to deliver the necessary current to simulate connector make/break scenarios. Examples of such scenarios can be found in U.S. patent application Ser. No. 14/015,335, which is hereby incorporated by reference for any purpose.

In general, there are two example use cases that request the battery simulator to be capable of delivering non-trivial amounts of current. The first use case is a dynamic change in voltage over time (dV/dt). It is believed that a high dV/dt into a capacitive load requires high peak currents. The second use case is current capacity. Current capacity can be the maximum peak or sustained current that a simulated cell is capable of delivering. So, a tester with a higher current capacity can deliver higher peak and sustained current compared to one with a lower current capacity. A higher dV/dt may be desirable as it provides a more realistic representation of battery cell behavior and more advanced testing capabilities. The definition of dV/dt is the time derivative of Pack Voltage, which can be on a battery cell level or a total battery pack basis. A high dV/dt means that the pack voltage quickly increases over time. For instance, a high dV/dt for a Pack Voltage might be 140 kilovolts per second, which means that the change in voltage divided by the time required for the change could be as high as 140,000. The dV/dt and current capacity performance metrics are antipodal characteristics as improving one diminishes the other. For example, as capacitance is added to increase current capability, dV/dt performance becomes overdamped. The present disclosure provides at least one solution to provide the two performance metrics and, hence, improve testing abilities.

FIG. 1 shows a battery simulation system 100 that includes controller 101 that controls operation of an analog output circuitry 103 and a switch controller 105. Controller 101 runs a battery simulation test, e.g., by executing instructions that can be stored internally received from another device (not shown). Analog output circuitry 103 produces an electrical signal for a device under test at the request of the controller 101 as needed for a particular test. These tests can be current capability test or voltage change tests. Switch controller 105 receives instructions from the controller 101 and based on these instructions sets the state of the mode circuitry 107. The mode circuitry 107 may alter the state to the output 109. The mode circuitry may set a plurality of states. One state can be a dynamic change in voltage over time (dV/dt) state. Another state can be a voltage change state. Another state can be a current capacity state. The output 109 can be connected to a device under test, e.g., an electrical control module. With the mode circuitry 107 being capable of changing state, e.g., circuitry influencing the output signal to the device under test, and the output characteristics to the device under test, the simulated battery can provide the output for a given test being simulated.

Figure 2:
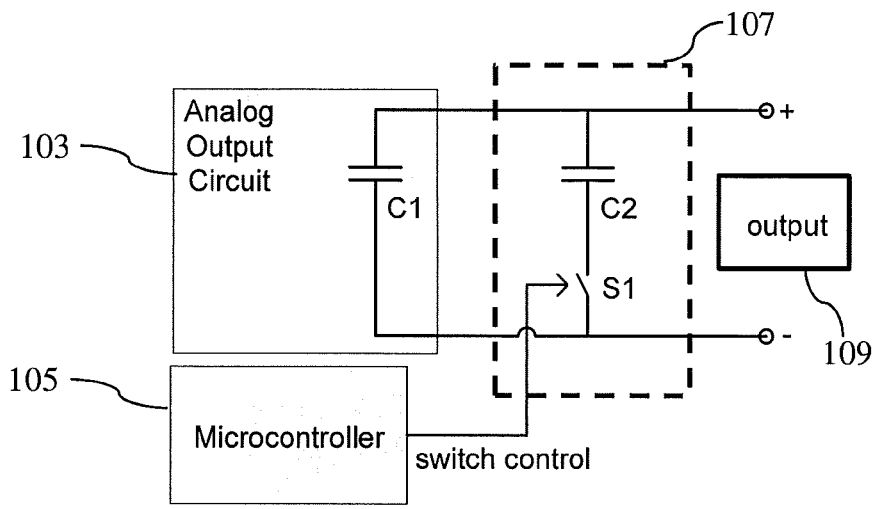
FIG. 2 is schematic view of a simulation system according to an example.

The two of the modes, i.e., dV/dt state and current capacity state, can support various battery tests. Here are some examples. In the dV/dt state, the battery simulator is able to achieve the fast dynamics of a real battery pack as recorded from actual vehicle performance. For instance, an instrumentation system and a data logger, if properly configured, can record the time data of the battery pack's voltage output and may also include individual cell voltages. Generally, this pack voltage exhibits high dV/dt such as 140 kV/sec as previously indicated. Now, by controlling the battery simulator from the data log file, the simulator is able to "play back" the same profile as was seen on a real battery pack. It is important to set the mode circuitry 107 to the dV/dt mode in order to be able to obtain these fast dynamics. And now, we will consider the current capacity state. Referring to FIG. 2, switch 51 will be closed which adds a large capacitive load C2 onto the simulator output 109. There are several stress tests for a battery energy control module under test such as Hot Plug, which means to simulate the effects of plugging the connectors of the controller into a live battery. At the moment of plug in, there is a tendency for large peak currents to be drawn so as to charge up front end capacitors in the controller circuits. Since the simulator here is in current capacity mode, the simulator utilizes its energy reservoir, capacitance C2, to achieve high actual peak currents into the module. In some instances this is able to re-create a possible failure condition.

FIG. 2 shows a more detailed schematic of a battery simulation system. The mode circuitry 107 includes a switch S1 and a capacitor C2 and switch S2. The analog output circuitry is shown as including the capacitance C1. The switch S1 is controlled by the switch controller 105. Switch S1 has two states, open (non-conducting) and closed (conducting). Capacitance C1 is the relatively low equivalent capacitance of the unmodified circuitry of the analog output circuitry 103 that allows the high dV/dt performance metrics to be met with the switch S1 in the open state. The controller 105 controls S1 and in the closed state thus adds capacitor C2 into the circuitry which allows the high current capacity performance metric to be met. In the closed state the capacitor C2 is in parallel with capacitance C1 and the output terminals. It will be recognized that a plurality of electrical components can be switched at the output to control the output signal with regard to the load represented by the electrical control module.

Figure 3:
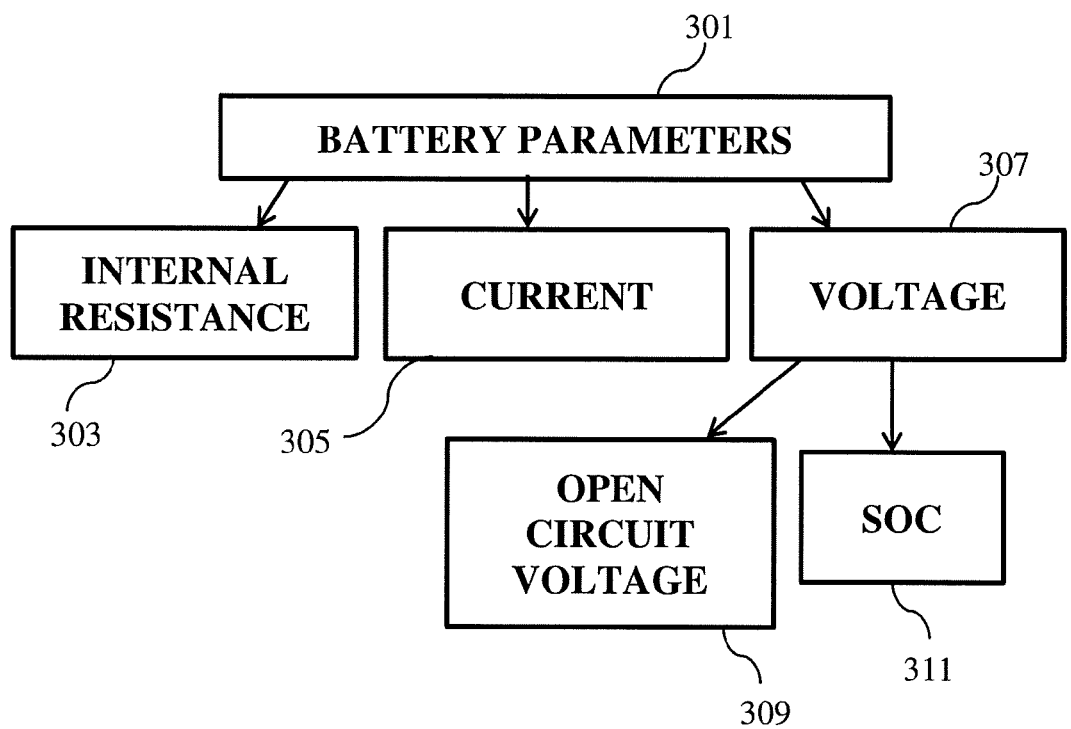
FIG. 3 is a schematic view of battery parameters that may be simulated.

FIG. 3 shows battery parameters 301 that can be simulated at the output of the battery simulator. These battery parameters 301 can include the internal resistance 303, current 305, and voltage 307. Internal resistance 303 of the battery may include ionic resistance, electronic resistance and/or kinetic resistance. These battery parameters may be provided by the battery manufacturer or determined during other testing for a specific battery to be simulated by the battery simulator 100.

Figure 4:
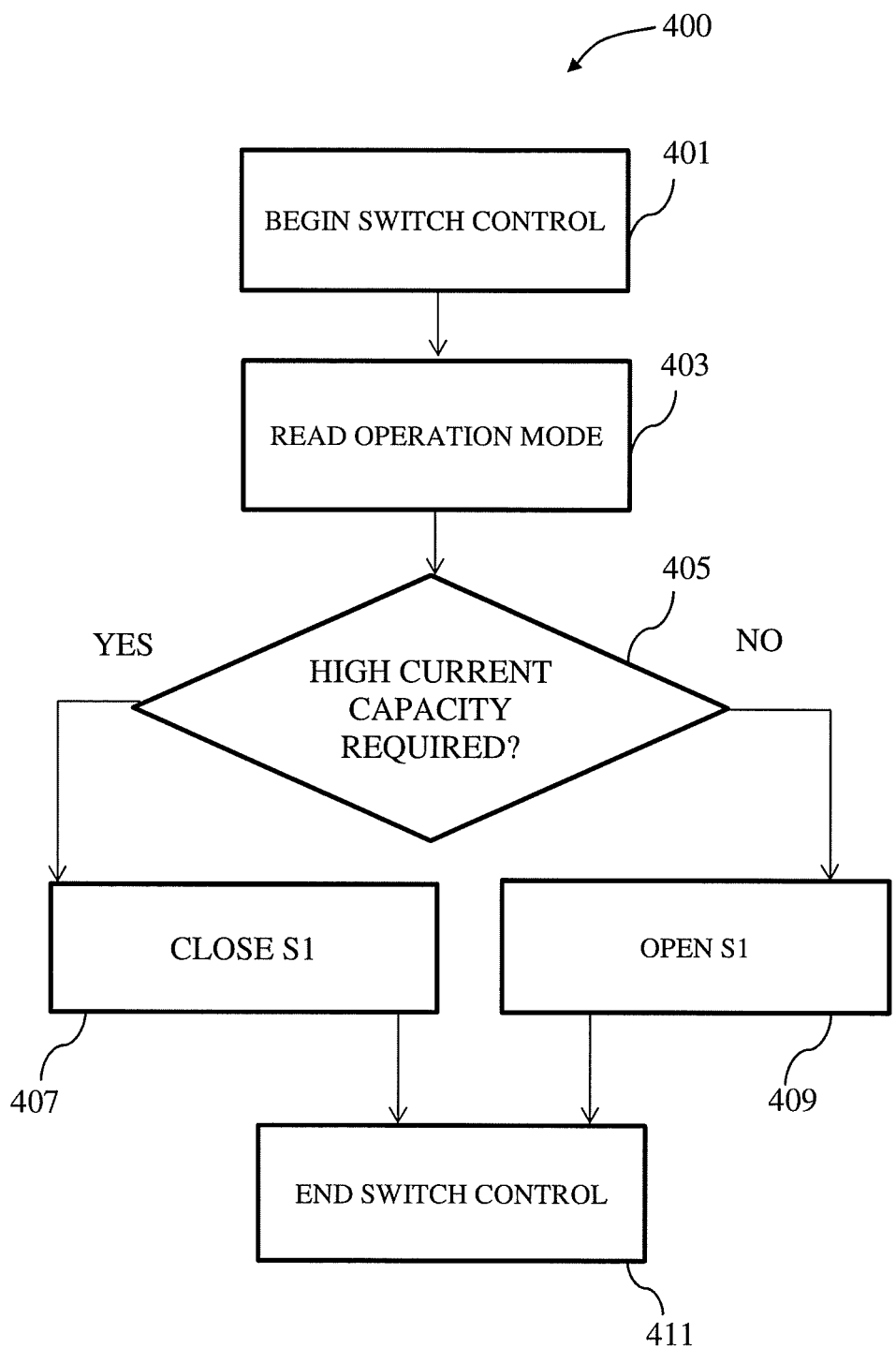
FIG. 4 shows a method for simulating a battery for a device under test.

FIG. 4 shows a battery simulation method 400, which in some examples may be performed using the battery simulator 100. At 401, switch control begins to set the state of output from a battery simulator to provide the output signal to the device under test, e.g., the battery control circuitry, ECM or BECM. At 403, the operation mode of the device under test is determined. In an example, the battery simulator received a signal indicating the test mode of the device under test. At 405, it is determined whether the test mode should have a high current capacity. In an example, the high current mode is about 5.0 amps per battery cell or current source being simulated. If yes, then the mode circuitry is set to a high current mode, at 407. In an example, a switch is closed such that additional circuitry is added to the output of the battery simulator. The switch can electrically connect a capacitance at the output. The capacitance can be a single capacitor or an electrical network with additional elements with the capacitor or a plurality of capacitors. In an example, the threshold of current needed for the test exceeds a threshold value (e.g., greater than four amps, greater than 4.5 amps or greater than or equal to 5 amps), then the switch is closed to apply additional capacitance across the output. If at 405 no high current capacity is requested for the test, then the flow moves to step 409. At 409, the mode circuitry is set at a non-high current state. In an example, a switch is open and additional capacitance is not connected across the output of the battery simulator. The default state of the switch or the mode circuitry is with the additional circuitry not affecting the output of the battery simulator signal at the output to any appreciable extent. In an example, in response to a demand for current less than the threshold, using switch control to open the switch to remove the additional capacitance from across the output or hold the additional capacitance from across the output. At 411, the switch control is ended.

Figure 5:
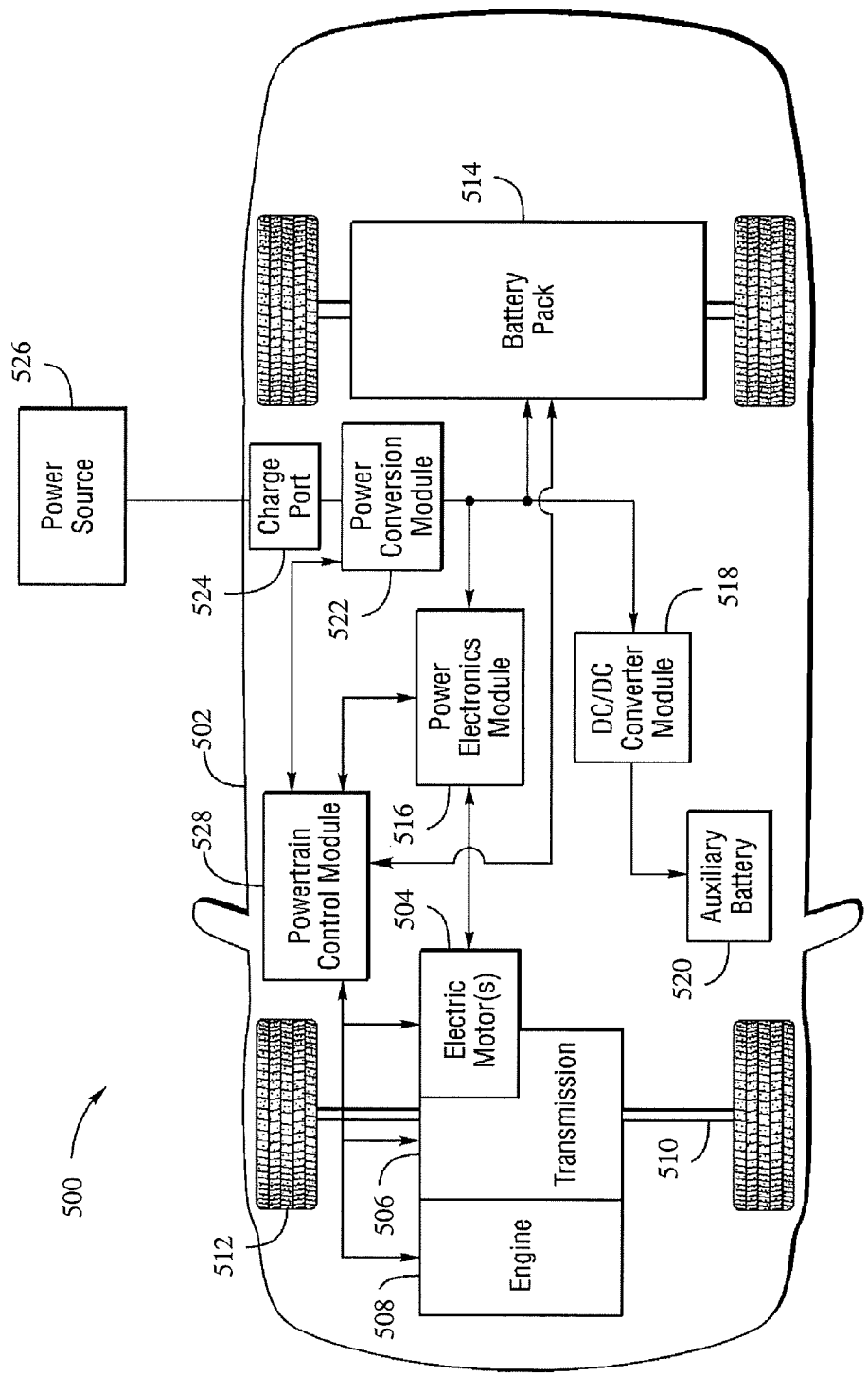
FIG. 5 is an example hybrid-electric vehicle with a battery pack.

FIG. 5 depicts an example of an electric vehicle 502 (e.g., a plug-in hybrid electric vehicle) that can have an ECM that while being tested interacts with battery simulator 100. A plug-in hybrid electric vehicle 502 may comprise one or more electric motors 504 mechanically connected to a hybrid transmission 506. In addition, the hybrid transmission 506 is mechanically connected to an engine 508, for example an internal combustion engine. The hybrid transmission 506 may also be mechanically connected to a drive shaft 510 that is mechanically connected to the wheels 512. The electric motors 504 can provide propulsion when the engine 508 is turned on. The electric motors 504 can provide deceleration capability when the engine 508 is turned off. The electric motors 504 may be configured as generators and can provide fuel economy benefits by recovering energy that would normally be lost as heat in the friction braking system. The electric motors 504 may also reduce pollutant emissions since the hybrid electric vehicle 502 may be operated in electric mode under certain conditions.

The traction battery or vehicle battery pack 514 stores energy that can be used by the electric motors 504. A vehicle battery pack 514 typically provides a high voltage DC output. The battery pack 514 is electrically connected to a power electronics module 516, which can include the ECM described herein. The power electronics module 516 is also electrically connected to the electric motors 504 and provides the ability to bi-directionally transfer energy between the battery pack 514 and the electric motors 504. For example, a typical battery pack 514 may provide a DC voltage while the electric motors 504 may need a three-phase AC current to function. The power electronics module 516 may convert the DC voltage to a three-phase AC current as required by the electric motors 504, for example, by using an inverter module. In a regenerative mode, the power electronics module 516 will convert the three-phase AC current from the electric motors 504 acting as generators to the DC voltage required by the battery pack 514, also using an inverter module or other circuitry. The methods described herein are equally applicable to a pure electric vehicle or any other device or vehicle using a battery pack. The battery pack 514 can by modeled and simulated by the battery simulator 100.

In addition to providing energy for propulsion, the battery pack 514 may provide energy for other vehicle electrical systems. A typical system may include a DC/DC converter module 518 that converts the high voltage DC output of the battery pack 514 to a low voltage DC supply that is compatible with other vehicle loads. Other high voltage loads, such as compressors and electric heaters, may be connected directly to the high-voltage bus from the battery pack 514. In a typical vehicle, the low voltage systems are electrically connected to a 12V battery 520. An all-electric vehicle may have a similar architecture but without the engine 508.

The battery pack 514 may be recharged by an external power source 526. The external power source 526 may provide AC or DC power to the vehicle 502 by electrically connecting through a charge port 524. The charge port 524 may be any type of port configured to transfer power from the external power source 526 to the vehicle 502. The charge port 524 may be electrically connected to a power conversion module 522. The power conversion module may condition the power from the external power source 526 to provide the proper voltage and current levels to the battery pack 514. In some applications, the external power source 526 may be configured to provide the proper voltage and current levels to the battery pack 514 and the power conversion module 522 may not be necessary. The functions of the power conversion module 522 may reside in the external power source 526 in some applications. The vehicle engine, transmission, electric motors, battery, power conversion and power electronics may be controlled by a powertrain control module (PCM) 528. In an example, the ECM can be part of the PCM 528. The battery simulator 100 may model the battery pack 514 while it is connected to the charge port 524 and may be receiving a charge from the charge port 524.

In addition to illustrating a plug-in hybrid vehicle, FIG. 5 can illustrate a battery electric vehicle (BEV) if engine 508 is removed. Likewise, FIG. 5 can illustrate a traditional hybrid electric vehicle (HEV) or a power-split hybrid electric vehicle if components 522, 524, and 526 are removed. FIG. 5 also illustrates the high voltage system which includes the electric motor(s), the power electronics module 516, the DC/DC converter module 518, the power conversion module 522, and the battery pack 114. The high voltage system and battery pack includes high voltage components including bus bars, high voltage connectors, high voltage wires, and circuit interrupt devices.

Figure 6:
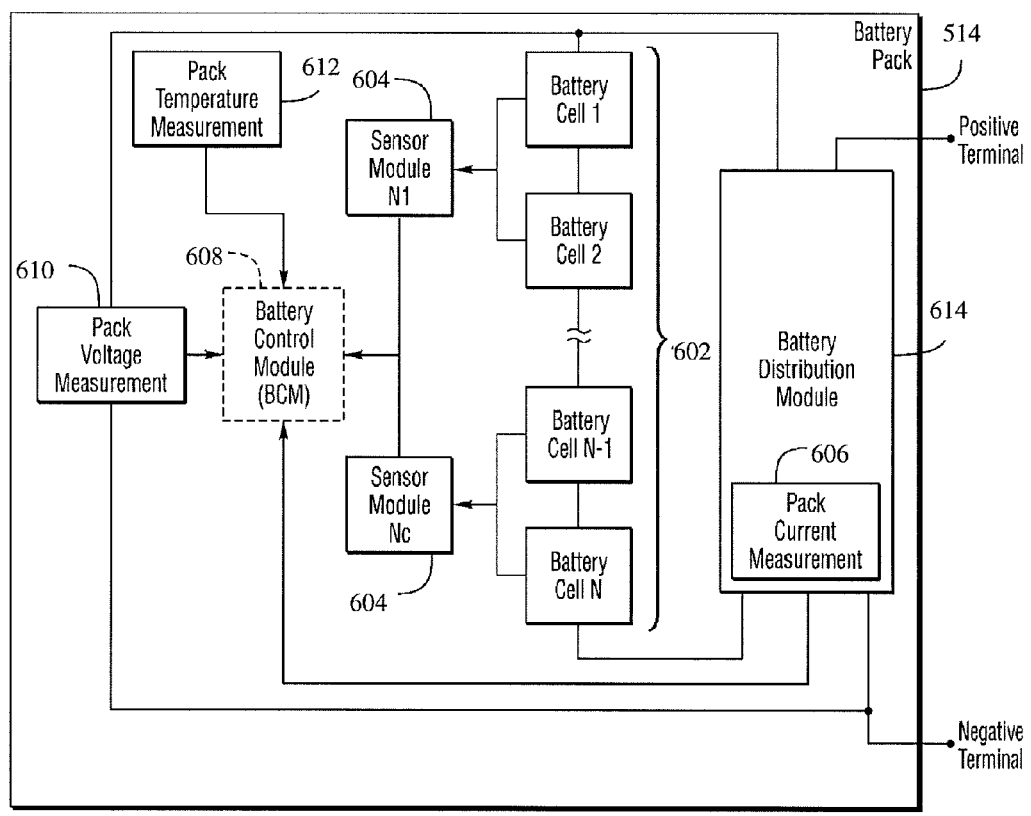
FIG. 6 is a view of a battery pack arrangement for an electric vehicle.

The individual battery cells within a battery pack can be constructed from a variety of chemical formulations. Typical battery pack chemistries may include but are not limited to lead acid, nickel cadmium (NiCd), nickel-metal hydride (NIMH), Lithium-Ion or Lithium-Ion polymer. FIG. 6 shows a typical battery pack 600 in a simple series configuration of N battery cell modules 602. The battery cell modules 602 may contain a single battery cell or multiple battery cells electrically connected in parallel. These battery cells can be modeled by the battery simulator 100. The battery pack, however, may be composed of any number of individual battery cells and battery cell modules connected in series or parallel or some combination thereof. A typical system may have one or more controllers, such as a Battery Energy Control Module (BCM) 608 that monitors and controls the performance of the battery pack 600. The BCM 608 may monitor several battery pack level characteristics such as pack current measured by a current sensor 606, pack voltage 610 and pack temperature 612. The performance of the current sensor 606 may be important, in certain arrangements, to build a reliable battery monitoring system. The accuracy of the current sensor may be useful to estimate the battery state of charge and capacity. A current sensor may utilize a variety of methods based on physical principles to detect the current including a Hall effect IC sensor, a transformer or current clamp, a resistor in which the voltage is directly proportional to the current through it, fiber optics using an interferometer to measure the phase change in the light produced by a magnetic field, or a Rogowski coil. In the event a battery cell is charging or discharging such that the current entering or exiting the battery cell exceeds a threshold, the battery control module may disconnect the battery cell via the use of a circuit interrupt device (CID)

such as a fuse or circuit breaker. The BCM 608 may be the device to be connected to the battery simulator 100 to test operation of the BCM.

In addition to the pack level characteristics, there may be battery cell level characteristics that need to be measured and monitored. For example, the terminal voltage, current, and temperature of each cell may be measured. A system may use a sensor module 604 to measure the characteristics of one or more battery cell modules 602. The characteristics may include battery cell voltage, temperature, age, number of charge/discharge cycles, etc. Typically, a sensor module will measure battery cell voltage. Battery cell voltage may be voltage of a single battery or of a group of batteries electrically connected in parallel or in series. The battery pack 600 may utilize up to $N_c$ sensor modules 604 to measure the characteristics of all the battery cells 602. Each sensor module 604 may transfer the measurements to the BCM 608 for further processing and coordination. The sensor module 604 may transfer signals in analog or digital form to the BCM 608. The battery pack 600 may also contain a battery distribution module (BDM) 614 which controls the flow of current into and out of the battery pack 600. The battery simulator 100 may simulate the battery pack 600 or cells of the battery pack.

Figure 7:
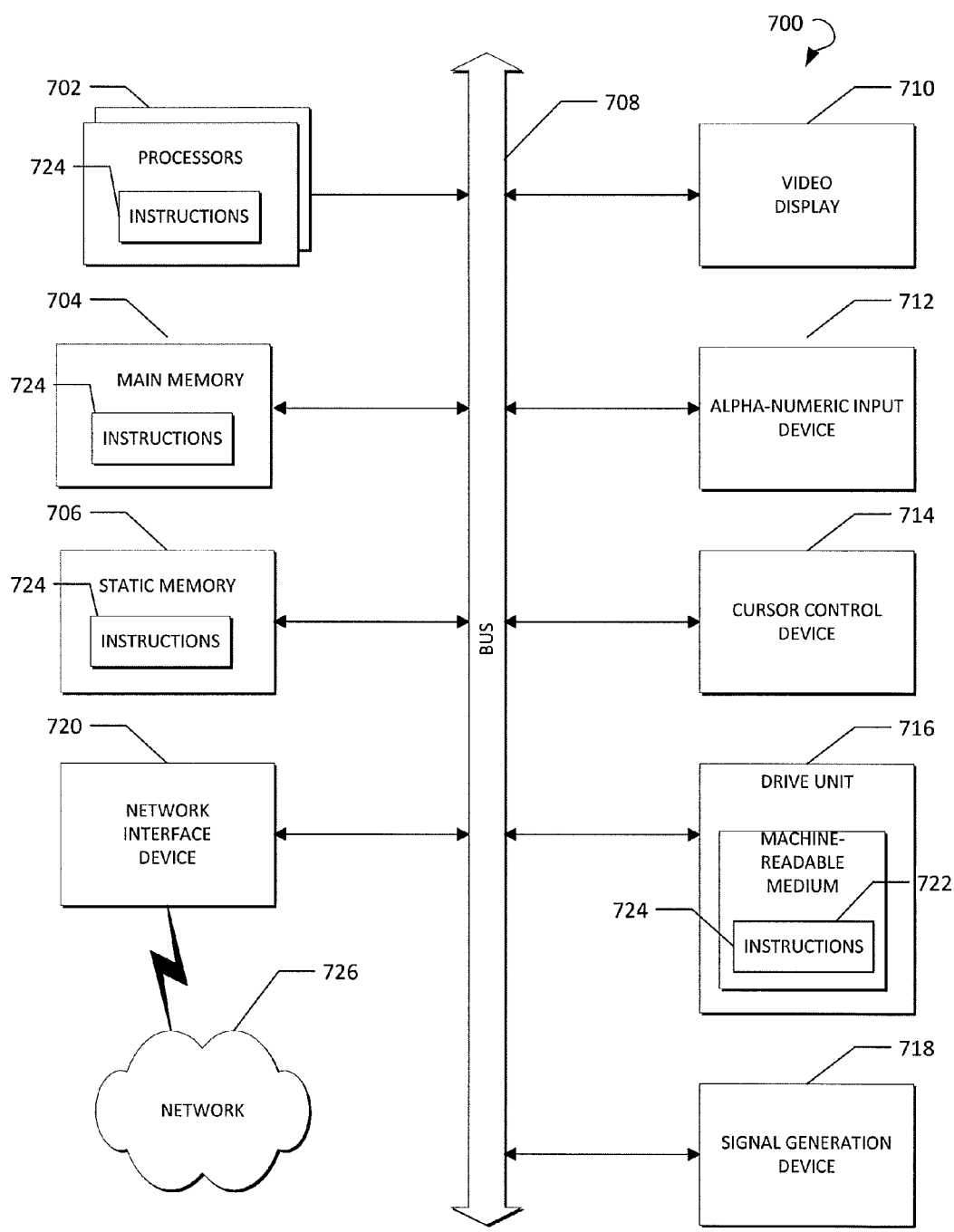
FIG. 7 is a view of a machine that can execute the methods described herein, act as the battery simulator controller or act as the battery electronic control module, or combinations thereof.

FIG. 7 shows a diagrammatic representation of machine in the example form of a computer system 700 within which a set of instructions may be executed causing the machine to perform any one or more of the methods, processes, operations, or methodologies discussed herein. The battery simulator system 100, as described herein, may operate on one or more computer systems 700. The battery simulator system 100 may include the functionality of one or more computer systems 700 or parts of the computer system 700.

In an example, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The computer system 700 includes a processor 702 (e.g., a central processing unit (CPU) a graphics processing unit (GPU) or both), a main memory 704 and a static memory 706, which communicate with each other via a bus 708. The computer system 700 may further include a video display unit 710 (e.g., a liquid crystal display (LCD) or a cathode ray tube (CRT)). The computer system 700 also includes an alphanumeric input device 712 (e.g., a keyboard), a cursor control device 714 (e.g., a mouse, touch screen, joystick, track pad or the like), a drive unit 716, a signal generation device 718 (e.g., a speaker) and a network interface device 720.

The drive unit 716 includes a machine-readable medium 722 on which is stored one or more sets of instructions (e.g., software 724) embodying any one or more of the methodologies or functions described herein. The software 724 may also reside, completely or at least partially, within the main memory 704 and/or within the processor 702 during execution thereof by the computer system 700. The main memory 704 and the processor 702 also constituting machine-readable media.

The software 724, e.g., instructions, may further be transmitted or received over a network 726 via the network interface device 620 via communication protocols that can code and decode data for transmission. The software 724 can also be communicated over the bus 708.

While the machine-readable medium 722 is shown in an example to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the embodiments of the present invention. Such media can include tangible media. The term "machine-readable medium" shall accordingly be taken to include, but not be limited to, buses, tangible carrier wave signals, solid-state memories, and optical and magnetic media As described herein, the introduction of different battery simulator operational states provides both the high dV/dt and current capacity performance metrics. Many battery simulator use cases require the high dV/dt performance. Some use cases require high current capacity. By introducing mode circuitry, e.g., a switched capacitance circuit in the output circuit under software control, the current capacity can be added and removed on demand and during testing. As a result a more thorough and dynamic testing of controllers, e.g., a battery energy control module, can be performed.

A battery simulator, e.g., a traction battery simulator, may include a controller, analog output circuitry being controlled by the controller to output test current and test voltage, and switching circuitry, connected to the analog output circuitry, that has a first state and a second state. In an example, the controller controls whether the collective circuitries are in the first state or the second state based on current demand. In an example, the second state can provide a higher current state than the first state. In an example, the switching circuitry includes a switch and a capacitor electrically connected across an output of the analog output circuitry. In an example, a plurality of power supplies may be connected to simulate a traction battery at the analog circuitry. In an example, the collective circuitries are connected to output the test current and test voltage to an electronic control module for a hybrid electric vehicle. In an example, the battery simulator may include a second state providing for a higher current state than the first state. In an example, the higher current state can be up to five amps per cell. In an example, the battery simulator may include the switching circuitry that includes a switch and a capacitor electrically connected across an output of the analog output circuitry. In an example, the battery simulator may include a plurality of power supplies that are connected to simulate a traction battery at the analog circuitry. In an example, the battery simulator may include switching circuitry that is connected to output the test current and the test voltage to an electronic control module for a hybrid electric vehicle.

Various methods can be performed by the systems. The method can include starting switch control at an output, in response to a demand for current exceeding a threshold, using the switch control to close a switch and apply additional capacitance across the output, and in response to a demand for current less than the threshold, using the switch control to open the switch to remove the additional capacitance from across the output. In an example, the method can include altering a rate of change of a voltage signal applied to the output and to an electronic control module connected to the output. In an example, using the switch control to close the switch damps the rate of change of the voltage signal applied to the output.

An electric vehicle battery simulation method can include controlling analog output circuitry to output test current and test voltage. The method can include controlling analog output circuitry to output test current and test voltage and switching the circuitry between a first state and a second state based on current demand, the first state having a decreased capacitance that permits increased rates of change in voltage relative to the second state. In an example, the switching includes closing a switch to connect a capacitor across the analog output circuitry to switch from the first state to the second state. In an example, the controlling includes connecting a device under test to an output of the analog output circuitry. In an example, the switching includes opening the switch, further comprising altering a rate of change of the test voltage to test an engine control module connected with the analog output circuitry. In an example, the second state damps a rate of change in the test voltage.

The present document describes modules and it will be understood that modules can be hardware, e.g., circuitry, processor, and/or memory, which acts on inputs to produce outputs. A module can include instructions that can be executed in hardware to produce outputs. The hardware when loaded with instructions acts a dedicated machine.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A traction-battery simulator comprising:
   an analog-circuitry controller;
   analog output circuitry controlled by the analog-circuitry controller to output analog test current and analog test voltage to a test vehicle-battery-controller; and
   switching circuitry connected across the analog output circuitry, the circuitries collectively having a first state and a second state, the second state having an increased capacitance that hinders rates of change in the test voltage to the test vehicle-battery-controller relative to the first state.

2. The battery simulator of claim 1, wherein the analog-circuitry controller controls whether the collective circuitries are in the first state or the second state based on current demand from the test vehicle controller.

3. The battery simulator of claim 1, wherein the second state provides for a higher current state than the first state, wherein the second state is a current capacity state for a traction battery, and wherein the first state is a dynamic change of traction battery voltage over time.

4. The battery simulator of claim 1, wherein the switching circuitry includes a switch and a capacitor electrically connected across an output of the analog output circuitry.

5. The battery simulator of claim 1, further comprising a plurality of power supplies connected to simulate a traction battery at the analog circuitry.

6. The battery simulator of claim 1, wherein the collective circuitries are connected to output the test current and test voltage to an electronic control module for a hybrid electric vehicle.

7. A method to simulate a hybrid vehicle traction-battery comprising:
   starting switch control at an output;
   controlling rates of change in a test voltage to a test vehicle-battery-controller using:
      in response to a test vehicle-battery-controller demand for analog current exceeding a threshold, using the switch control to close a switch and apply additional capacitance across the output; and
      in response to the test vehicle-battery-controller demand for analog current less than the threshold, using the switch control to open the switch to remove additional capacitance from across the output.

8. The method of claim 7 further comprising altering a rate of change of a voltage signal applied to the output and to an electronic control module connected to the output to provide a current capacity state for the simulated traction battery and a dynamic change of traction battery voltage over time.

9. The method of claim 8, wherein using the switch control to close the switch damps the rate of change of the voltage signal applied to the output.

10. An electric vehicle battery simulation method comprising:
    controlling analog output circuitry to output analog test current and analog test voltage to a vehicle traction battery controller-under-test; and
    switching the circuitry between a first state and a second state based on current demand from the vehicle traction battery controller-under-test, the first state having a decreased capacitance that permits increased rates of change in voltage relative to the second state.

11. The method of claim 10, wherein the switching includes closing a switch to connect a capacitor across the analog output circuitry to switch from the first state to the second state to control an electrical signal to an engine control module in both the first state and the second state, with the first state being dynamic change in battery voltage over time and the second state being high current capacity.

12. The method of claim 11, wherein the switching includes opening the switch, further comprising altering a rate of change of the test voltage to test the engine control module connected with the analog output circuitry.

13. The method of claim 10, wherein the controlling includes connecting a device under test to an output of the analog output circuitry.

14. The method of claim 10, wherein the second state damps a rate of change in the test voltage.

15. The method of claim 10, wherein the switching includes opening the switch and altering a rate of change of the test voltage to test an engine control module connected with the analog output circuitry;
    wherein the controlling includes connecting a device under test to an output of the analog output circuitry,
    wherein the second state damps a rate of change in the test voltage, and
    wherein the analog output circuitry is connected to an electrical source that is not a traction battery.

16. The method of claim 15, wherein the switching includes closing a switch to connect a capacitor across the analog output circuitry to switch from the first state to the second state to control an electrical signal to the engine control module in both the first state and the second state, with the first state being dynamic change in battery voltage over time and the second state being high current capacity.

17. A traction-battery simulator comprising:
   analog output circuitry controlled by an analog-circuitry controller to output analog test current and analog test voltage to a test vehicle-battery-controller; and
   switching circuitry connected across the analog output circuitry, the circuitries collectively having a first state and a second state, the second state having an increased capacitance that hinders rates of change in the test voltage to the test vehicle-battery-controller relative to the first state.

18. The method of claim 15, wherein the analog output circuitry is connected to an electrical power source that is not a traction battery.

* * * * *